United States Patent
Daus et al.

(10) Patent No.: US 11,908,690 B2
(45) Date of Patent: Feb. 20, 2024

(54) MULTI-LAYERED SEMICONDUCTIVE DEVICE AND METHODOLOGY WITH POLYMER AND TRANSITION METAL DICHALCOGENIDE MATERIAL

(71) Applicant: The Board of Trustees of the Leland Stanford Junior University, Stanford, CA (US)

(72) Inventors: Alwin S. Daus, Mountain View, CA (US); Sam Vaziri, Mountain View, CA (US); Eric Pop, Palo Alto, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 43 days.

(21) Appl. No.: 17/619,514

(22) PCT Filed: Jun. 19, 2020

(86) PCT No.: PCT/US2020/038809
§ 371 (c)(1),
(2) Date: Dec. 15, 2021

(87) PCT Pub. No.: WO2020/257703
PCT Pub. Date: Dec. 24, 2020

(65) Prior Publication Data
US 2022/0246430 A1    Aug. 4, 2022

Related U.S. Application Data

(60) Provisional application No. 62/864,232, filed on Jun. 20, 2019.

(51) Int. Cl.
*H01L 21/02*    (2006.01)
*H01L 29/40*    (2006.01)
(Continued)

(52) U.S. Cl.
CPC .. *H01L 21/02568* (2013.01); *H01L 21/02422* (2013.01); *H01L 29/401* (2013.01); *H01L 29/41775* (2013.01); *H01L 29/0673* (2013.01)

(58) Field of Classification Search
CPC ......... H01L 21/02568; H01L 21/02422; H01L 29/401; H01L 29/41775; H01L 29/0673;
(Continued)

(56) References Cited

U.S. PATENT DOCUMENTS 9,548,394 B2    1/2017 Das et al.
10,074,737 B2    9/2018 Lee et al.
(Continued)

FOREIGN PATENT DOCUMENTS

| CN | 107238648 A | 10/2017 | |
| EP | 3131121 A1 * | 2/2017 | ........... H01L 29/401 |
| KR | 101631008 B1 | 6/2016 | |

OTHER PUBLICATIONS

USPTO. International Search Report and Written Opinion dated Nov. 9, 2020, for parent PCT Application No. PCT/US2020/038809, 19 pages.
(Continued)

*Primary Examiner* — John P. Dulka
(74) *Attorney, Agent, or Firm* — Crawford Maunu PLLC

(57) ABSTRACT

In certain examples, methods and semiconductor structures are directed to multilayered structures including TMD (transition metal dichalcogenide material or TMD-like material and a polymer-based layer which is characterized as exhibiting flexibility. A first layer including a TMD-based material (e.g., an atomic-thick layer including TMD) or TMD-like material is provided or grown on a surface which in certain instances may be a rigid platform or substrate. A plurality of electrodes are provided on or as part of the first layer, and another layer or film including polymer is applied to cover
(Continued)

the first layer and the electrodes. The other layer is integrated with the TMD material or TMD-like material and the first layer, and the other layer provides a flexible substrate such as when released from the exemplary rigid platform or substrate.

23 Claims, 7 Drawing Sheets

(51) Int. Cl.
*H01L 29/417* (2006.01)
*H01L 29/06* (2006.01)

(58) Field of Classification Search
CPC .............. H01L 29/41725; H01L 29/24; H01L 29/66969; H01L 29/778; H01L 21/7806; H01L 29/78681
See application file for complete search history.

(56) References Cited

U.S. PATENT DOCUMENTS

| | | | |
|---|---|---|---|
| 2004/0079728 A1* | 4/2004 | Mungekar | H01L 21/02129 257/E21.279 |
| 2007/0034599 A1 | 2/2007 | Chen | |
| 2010/0123993 A1* | 5/2010 | Laor | H01G 9/15 427/79 |
| 2015/0303315 A1 | 10/2015 | Das et al. | |
| 2016/0093491 A1 | 3/2016 | Choi et al. | |
| 2016/0343670 A1 | 11/2016 | Lee et al. | |
| 2017/0012117 A1 | 1/2017 | Radosavljevic et al. | |

OTHER PUBLICATIONS

Park, et al. "Effective anp low-cost platinum electrodes for microbial fuel cells deposited by electron beam evaporation." Energy & fuels 21.5 (Sep. 19, 2007): 2984-2990.

Salvatore, et al. "Fabrication and transfer of flexible few-layers MoS2 thin film transistors to any arbitrary substrate." ACS nano 7.10 (Oct. 22, 2013): 8809-8815.

Yoon, et al. "Highly flexible and transparent multilayer MoS2 transistors with graphene electrodes." Small 9.19 (Oct. 11, 2013): 3295-3300.

Chang, et al. "High-performance, highly bendable MoS2 transistors with high-k dielectrics for flexible low-power systems." ACS nano 7.6 (Jun. 25, 2013): 5446-5452.

Daus, et al. "High-Performance Flexible Nanoscale Field-Effect Transistors Based on Transition Metal Dichalcogenides." (Sep. 9, 2020).

Shinde, S. M. et al. "Surface-Functionalization-Mediated Direct Transfer of Molybdenum Disulfide for Large-Area Flexible Devices." J.-H., Adv. Funct. Mater. 2018, 28, 1706231.

Van Ngoc, Huynh, et al. "PMMA-etching-free transfer of wafer-scale chemical vapor deposition two-dimensional atomic crystal by a water soluble polyvinyl alcohol polymer method." Scientific reports 6.1 (2016): 1-9.

Park IJ , Kim TI , Kang S , Shim GW , Woo Y , Kim TS , Choi SY . Stretchable thin-film transistors with molybdenum disulfide channels and graphene electrodes. Nanoscale. Aug. 30, 2018;10(34):16069-16078. Abstract Only.

Pu, Jiang, et al. "Highly flexible MoS2 thin-film transistors with ion gel dielectrics." Nano letters 12.8 (2012): 4013-4017.

* cited by examiner

Before transfer

After transfer

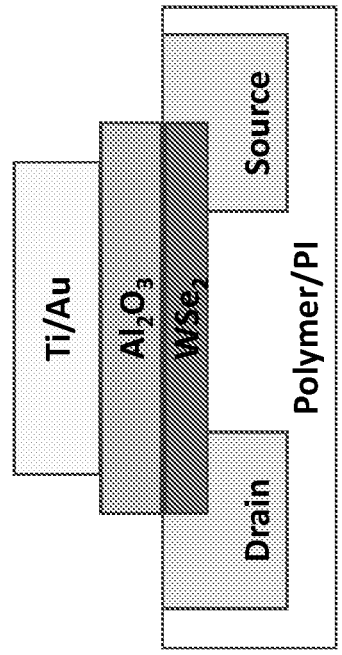
FIG. 7C
FIG. 7D
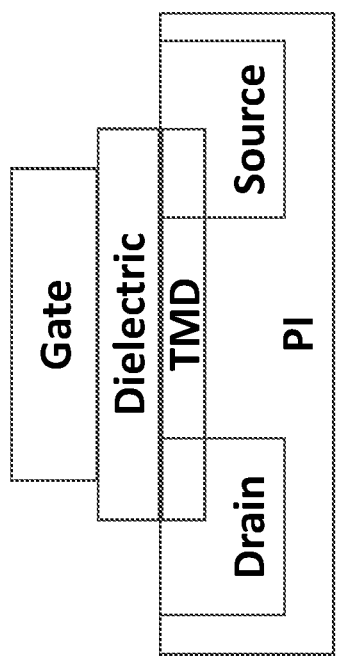
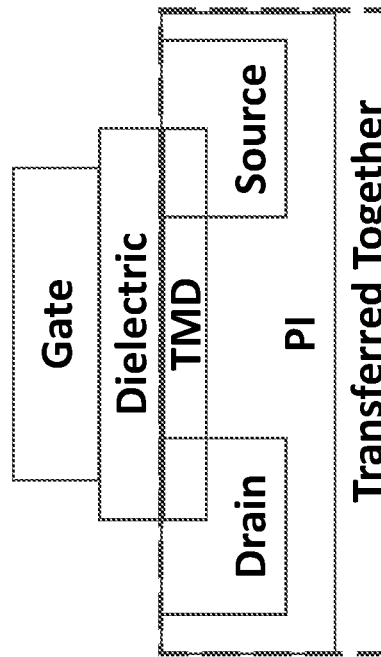
FIG. 7A
FIG. 7B

MULTI-LAYERED SEMICONDUCTIVE DEVICE AND METHODOLOGY WITH POLYMER AND TRANSITION METAL DICHALCOGENIDE MATERIAL

FEDERALLY-SPONSORED RESEARCH AND DEVELOPMENT

This invention was made with Government support under contract 1542152 awarded by the National Science Foundation. The Government has certain rights in the invention.

BACKGROUND

Aspects of the present disclosure are related generally to the semiconductor devices and/or their manufacture. As examples, such devices include field-effect transistors (FETs), diodes and the like.

Using one applicable technology type for ease of discussion, "Internet-of-Things" (IoT) have become increasingly prevalent in electronics. From monitoring the environment and machines around us to even the human body, IoT envisions electronics physically present in every aspect of our daily lives and has led to predictions that 45 trillion sensors will be needed by the late 2020s. While some of these electronic devices and sensors may be realized by energy efficient rigid silicon electronics, there will be the need for electronics with new non-planar form factors, which are thin and light-weight, and can be conformably attached to objects with unusual shapes, on the human skin or even implanted into the human body. With those applications in mind, there is a need to realize electronic devices on flexible substrates that are robust to mechanical strain, easily integrated and capable of low-power consumption as well as high performance at the nanoscale.

Recent works have suggested that certain low-dimensional materials are excellent candidates because of their ultimate thickness scalability and lack of dangling bonds, leading to high carrier mobility at <1 nm thickness, minimized short-channel effects and easy transfer onto arbitrary substrates. Among such candidates, monolayer transition metal dichalcogenides (TMDs) like molybdenum disulfide ($MoS_2$) may be particularly suitable for low-power applications due to their electronic band gaps (~1.5 eV to ~2.3 eV) being greater than silicon which enable low off-currents ($fA \cdot \mu m^{-1}$ demonstrated). However, the performance of flexible TMD transistors with nanoscale channel lengths is still elusive owing to the difficulty of realizing those dimensions on flexible substrates and TMD transfer processes which leave contamination and can cause damage to the atomically-thin semiconductors.

SUMMARY OF VARIOUS ASPECTS AND EXAMPLES

Certain aspects of the present disclosure are directed to a transfer process (and product) which facilitates the realization of high-performance short-channel TMD FETs on flexible substrates.

In one specific example, the present disclosure is directed to a method involving manufacture of a semiconductor device, stemming from partial manufacture such as a material transfer process to a completed manufacture of the device (e.g., a FET). The example method may include: on a surface, forming a first layer having TMD (transition metal dichalcogenide) material; forming a plurality of electrodes on or as part of the first layer; and applying another layer, including a polymer-based material (e.g., polyimide and/or other one or more other polymers such as PEN, PET, PDMS and SU-8) to cover the first layer and the plurality of electrodes. The other layer is therein integrated with the TMD material and the first layer, and the other layer provides a flexible substrate.

In another specific example, the present disclosure is directed to an apparatus including a semiconductor device. The semiconductor device includes a first layer including TMD material. It may also include electrodes formed on, or as part of, the first layer. The semiconductor device may also include another layer, having therein a polymer-based material (as in the examples above) and which is over the first layer and the plurality of electrodes. This layer may be integrated with the TMD layer and the first layer. The first with the other layer, may be released from the surface for providing a structure with flexibility that is independent of the above-noted exemplary surface. As in a more specific example, the other layer may be a flexible substrate (as useful for further processing of the semiconductor device).

Yet further aspects, according to the present disclosure, are directed to: a transfer method comprising: initially patterning FET contacts on a rigid TMD growth substrate (taking advantage of nanoscale lithography), then coating with a polymer-based material (such as listed in the above examples or simply a polyimide (PI) film) which becomes the flexible substrate after being released, with the contacts and TMD. In more detailed related aspects, this transfer process for other TMDs, like $WSe_2$ and $MoSe_2$, introducing minimal damage or contamination to these materials. Constructed $WSe_2$ FETs also exhibit impressively-high on-currents on flexible substrates, and at the same time, this is remarkable on flexible $MoSe_2$ FETs. Combined, these achievements push 2D semiconductors closer to a technology for low-power and high-performance flexible electronics.

Yet another example of the present disclosure involves an apparatus including a semiconductor device with a field-effect transistor which may have the electrodes corresponding to source/drain contacts adjacent to the TMD material. Also, it may have a transistor gate that is adjacent to the two-dimensional material. In the semiconductor device, a TMD-based material may include, for example, a three-atom-thick layer of $MoS_2$.

In other specific embodiments, the present disclosure presents a scalable method for fabricating flexible short-channel TMD transistors so as to avoid material contamination and damage, and enable the possibility for optimizing gate-to-drain/source overlaps to reduce parasitic resistances.

In yet other specific examples, the above examples are modified in that instead of being a TMD-based material (e.g., the material being dominated by TMD), another 2D material having similar attributes is used in place thereof; such attributes including, for example, compounds capable of being applied at a 2-atom-thickness or 3-atom-thickness such as including one of more of the elements found in such TMDs as exemplified herein (e.g., $MoS_2$, $WSe_2$, $MoSe_2$, etc.) and also characterized as exhibiting similar degrees of carrier mobility, flexibility and transparency on a (e.g., $SiO_2/Si$) substrate.

Such devices, in accordance with the present disclosure, may be part of various equipment, components and/or systems, as may be exemplified by flexible displays, electronic skin for healthcare, lightweight electronics, electronic label food packaging, flexible RFID tags, and electronics with conformal shapes.

It should be appreciated that the above discussion is not intended to characterize or allude to each aspect or example presented by the present disclosure.

BRIEF DESCRIPTION OF FIGURES

Various example embodiments, including experimental examples, may be more completely understood in consideration of the following detailed description in connection with the accompanying drawings, each in accordance with the present disclosure, in which:

FIG. 7A is a diagram illustrating a side profile of vertical 2D stack structure, according to the present disclosure;

FIG. 7B is a diagram illustrating a side profile of another vertical 2D stack structure, according to the present disclosure;

FIG. 7C is another diagram illustrating a side profile of another example device that is not necessarily a FET and/or one including a gate, according to the present disclosure; and FIG. 7D is another diagram illustrating a side profile of another specific example structure, according to the present disclosure.

Figure 1:
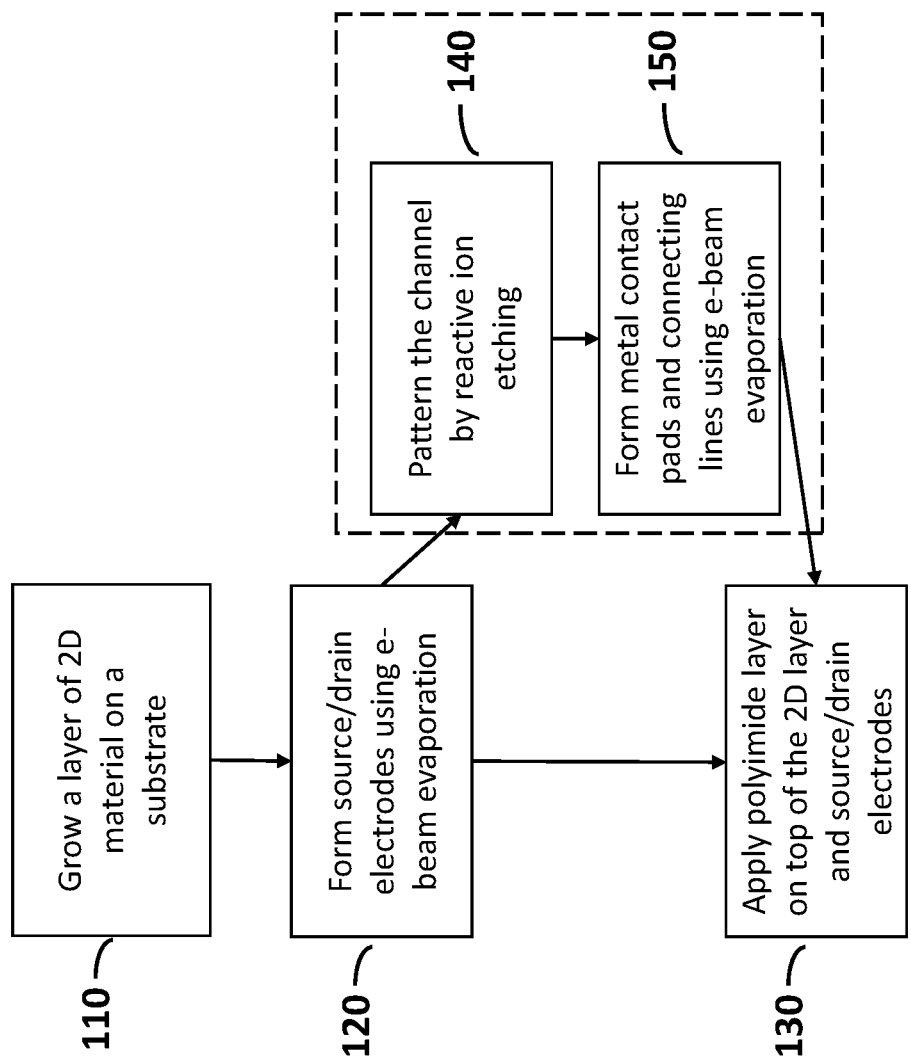
FIG. 1 is a block diagram illustrating an example of a method of fabrication for a flexible FET on a substrate surface, according to certain exemplary aspects of the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving devices characterized at least in part by high-performance flexible nanoscale devices such as field-effect transistors including TMD-based material. While the present disclosure is not necessarily limited to such aspects, an understanding of specific examples in the following description may be understood from discussion in such specific contexts.

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same connotation and/or reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

Exemplary aspects of the present disclosure are related to high-performance flexible nanoscale field-effect transistors based on transition metal dichalcogenides (TMDs). In specific examples, the TMD first layer material may be predominately composed of at least one type of TMD, and depending on performance specifications and applications, may include other materials such as one or a combination from among $WSe_2$, $MoSe_2$, $MoS_2$, $WS_2$, $InSe$ and $MoTe$, silicon, black phosphorus, carbon nanotubes, and graphene. In other specific examples, instead of being a TMD-based material (e.g., the material being dominated by TMD), another 2D material having similar attributes is used in place thereof; such attributes including, for example, compounds capable of being applied at a 2-atom-thickness or 3-atom-thickness such as including one of more of the elements found in such TMDs as exemplified herein (e.g., $MoS_2$, $WSe_2$, $MoSe_2$, etc.) and also characterized as exhibiting similar degrees of carrier mobility, flexibility and transparency on a (e.g., $SiO_2$/Si) substrate.

The TMD first layer material may also be characterized as exhibiting high carrier mobility. Such a high carrier mobility may be, for example, within the range of 10 $cm^2$/Vs to 200 $cm^2$/Vs.

In one specific example involving a method of manufacture of a semiconductor device, the method uses a surface of a growth substrate for forming a first layer having TMD-based material. Electrodes are formed or provided on or as part of the first layer. Another layer (or film) including polyimide or another polymer (as previously listed) is applied to cover the first layer and the electrodes. The other layer is integrated with the TMD material and the first layer, and once released from the surface of the growth substrate, the other layer provides a flexible substrate.

In this regard, the integration of the other layer and the first layer (and including the TMD-based material) has flexibility characteristics independent of any other structure such as an underlying rigid or flexible growth substrate, and/or a later-used structure or material against which layer-integrated structure is applied or affixed to (e.g., in applications such as a bio-sensor device where the layer-integrated structure may flex with a live tissue due to the independent flexibility characteristics or when part of another device which needs to flex for manipulating or directing light as in the case of opto-electronics applications). In certain specific examples, the structure as released from the (growth) surface may be characterized by a flexibility bending radius in a range of 10 mm to 100 micrometers. Accordingly, the flexibility characteristics of the transferred or released structure (e.g., as in FIG. 7B or 7C) are independent of such other structures, whether a growth surface as contemplated when manufacturing such device via a growth substrate or another surface used after transfer or of the remaining integrated layers (e.g., again as in FIG. 7B or 7C).

During the process of manufacturing the semiconductor device and as noted above in connection with substances such as deionized water, light acids and bases, in various examples the first layer and the above-noted (e.g., growth) surface may be secured to one another with sufficiently weak bonds to permit release or separation between the first layer and the surface without such damage or abrasion to the first layer that the transferred structure would be undermined for its intended purpose/application.

Consistent with the above aspects, such a manufactured device or method of such manufacture may involve aspects presented and claimed in U.S. Provisional Application Ser. No. 62/864,232 filed on Jun. 20, 2019 (STFD.411P1), to which priority is claimed. To the extent permitted, such subject matter is incorporated by reference in its entirety generally and to the extent that further aspects and examples (such as experimental and/more-detailed embodiments) may be useful to supplement and/or clarify.

Consistent with the present disclosure, such devices and/or methods may be used for producing (among other examples disclosed herein) flexible displays, electronic skin for healthcare, lightweight electronics, electronic label food packaging, flexible RFID tags, and electronics with conformal shapes.

As noted above, certain exemplary aspects of the present disclosure involve methodology and structures directed to growing a first layer including a TMD material (e.g., a few-to-several atoms thick application of a material including one or more of $MoS_2$, $WSe_2$, or $MoSe_2$), characterized as exhibiting flexibility, on a surface. Such methodology may also include forming (e.g., depositing) source/drain electrodes on the TMD first layer, for example, by e-beam evaporation. Also, such a method may also comprise of applying a polymer layer such as including polyimide to cover (e.g., on top) of the TMD first layer and source/drain electrodes.

Another example involves a method wherein the constructed semiconductor device is a field effect transistor (FET) and the electrodes, formed on the first layer are drain and source electrodes for the FET. The forming of the electrodes may be accomplished by patterning via lithography. The semiconductor construction method may also comprise of forming a channel. The forming of the channel may also include patterning the channel via reactive ion etching.

Another specific example involves the electrodes being formed by deposition employing e-beam evaporation and/or sputtering.

Yet another specific example involves the electrodes being formed by atomic-layer deposition.

Turning to the drawings, FIGS. 1A through 7D are used for exemplary discussion for aspects and examples that both relate to and supplement the above-described aspects and examples, also according to the present disclosure.

FIG. 1 is a block diagram illustrating a specific example of a method of fabrication a flexible FET on a flexible substrate. Block 110 depicts the initial step of growing a layer including a 2D material (e.g., a 3-atom-thick $MoS_2$, $WSe_2$, or $MoSe_2$) characterized as exhibiting high carrier mobility, flexibility and transparency on a (e.g., $SiO_2$/Si) substrate. Such as method may also comprise of forming (e.g., depositing) source/drain electrodes (denoted as 120) on the 2D layer by e-beam evaporation. Also, such as method may comprise of applying a polymer-based layer such as listed above on top of the 2D layer and source/drain electrodes (denoted as 130).

FIG. 1 also illustrates an alternative more specific example of a method of fabrication a flexible FET on a flexible substrate. Block 110 depicts the initial step of growing a layer including a 2D material (e.g., a 3-atom-thick $MoS_2$, $WSe_2$, or $MoSe_2$) characterized as exhibiting high carrier mobility, flexibility and transparency on a (e.g., $SiO_2$/Si) substrate. Such as method may also comprise of forming at block 120 (e.g., depositing) source/drain electrodes on the 2D layer, for example, by e-beam evaporation. From block 120, flow may proceed to block 130 for a step of applying another layer including polyimide (or another polymer-based material) on top of the 2D layer and source/drain electrodes.

In a particular example embodiment, a semiconductor device constructed according to such methodology as in FIG. 1 is further developed into an optical electronic device adapted to pass or manipulate light. In such a case, the two integrated layers (the other layer integrated with the TMD material and the first layer) are characterized by a transparency metric which is limited by a predetermined transparency characteristic associated with the TMD material and/or a transparency characteristic associated with the other layer integrated with the TMD material and the first layer. This may be highly advantageous for setting optimum transparency versus conductivity attributes associated specifications required for application performance (e.g., when the optical electronic device is a part of a solar collector or an interactive (e.g., capacitive-touch) display screen.

In another example also associated with FIG. 1, an alternate path flows from block 120 to block 140 where the process involves creation of a pattern for a FET channel by reactive ion etching. Next, at block 150 metal contact pads and connecting lines may be formed using e-beam evaporation. From block 150, flow proceeds to block 130 as in the previous example.

Figure 2A:
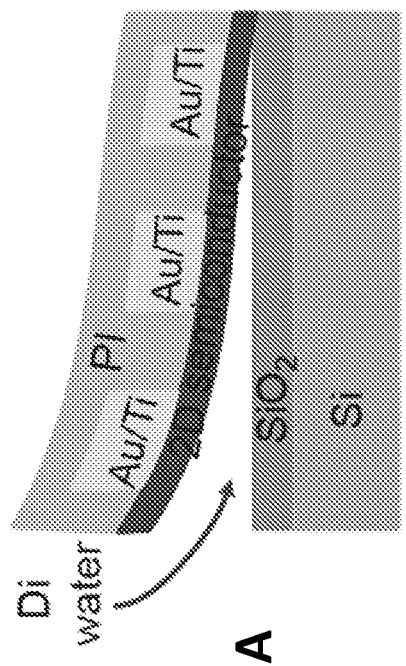
FIG. 2A is a diagram illustrating the separation of polyimide and source/drain electrodes from a substrate, according to certain exemplary aspects of the present disclosure.
Figure 2B:
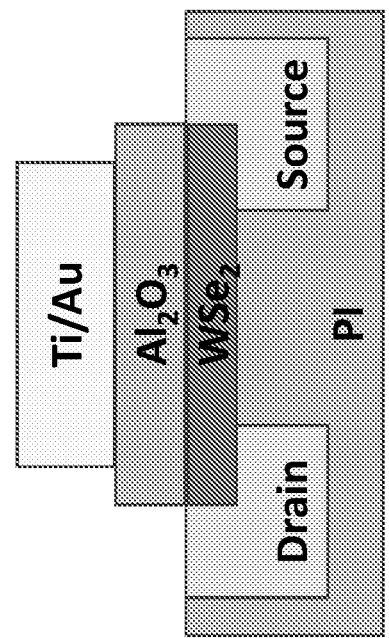
FIG. 2B is a diagram illustrating the device architecture, involving a TMD-based material such as $WSe_2$, of a FET device, according to certain exemplary aspects of the present disclosure.

FIG. 2A illustrates an example of releasing the 2D layer, the electrodes, and the polyimide or polymer-based layer from the substrate. This illustration depicts the release being effected by the use of deionized water as an example mechanism for the release/separation. The construction of a completed FET is shown in FIG. 2B and illustrates the released polymer layer with electrodes after being flipped and then followed by the deposition $WSe_2$, $Al_2O_3$, and Ti/Au.

In certain experimental embodiments, Raman spectroscopy and photoluminescence (PL) measurements were performed before and after transferring. Such measurements were useful to confirm that the TMDs remain structurally intact throughout the transfer process. Impressively, the Raman spectroscopy reveals no damage induced to the material in connection with or during transfer.

Figure 3B:
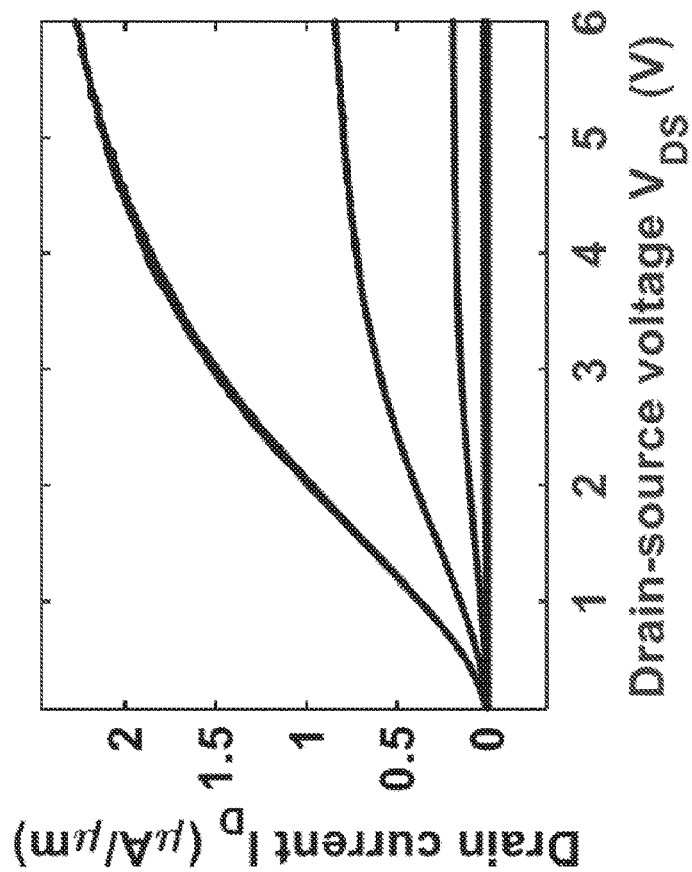
FIG. 3B is a graph of drain current versus drain-source voltage of a TMD-based material (such as $WSe_2$) transistors on polyimide, according to certain exemplary aspects of the present disclosure.
Figure 3A:
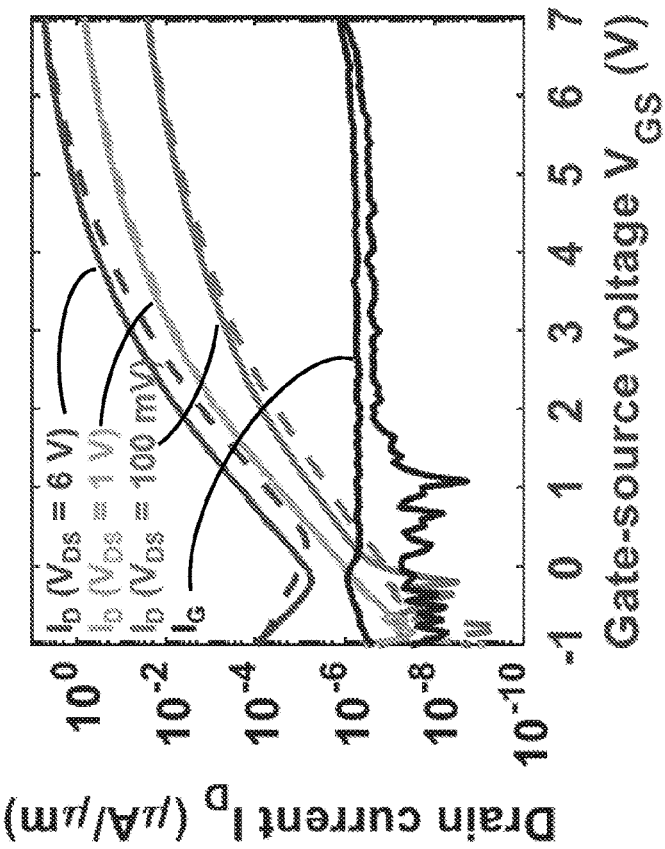
FIG. 3A is a graph of drain current versus gate-source voltage involving $WSe_2$ (as an exemplary TMD) on polyimide for transistors manufactured, according to certain exemplary aspects of the present disclosure.

FIG. 3A is an example graph of drain current versus gate-source voltage of a $WSe_2$ transistors on polyimide. The graph illustrates the transfer characteristics of a FET constructed using techniques described in various examples herein, and constructed including using TMD-based material as being or composed of $WSe_2$. FIG. 3B is a graph of drain current versus drain-source voltage of a $WSe_2$ transistors on polyimide, which illustrates the output characteristics of a FET constructed using techniques describe in examples herein, and constructed using such TMD-based material in accordance with the present disclosure.

Figure 4A:
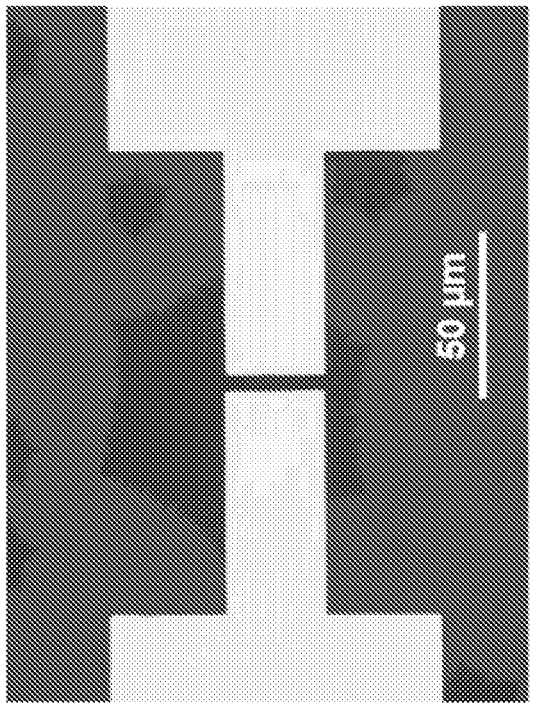
FIG. 4A is a microscope image of $MoSe_2$ and source/drain electrodes on a substrate before being transferred, according to certain exemplary aspects of the present disclosure.
Figure 4B:
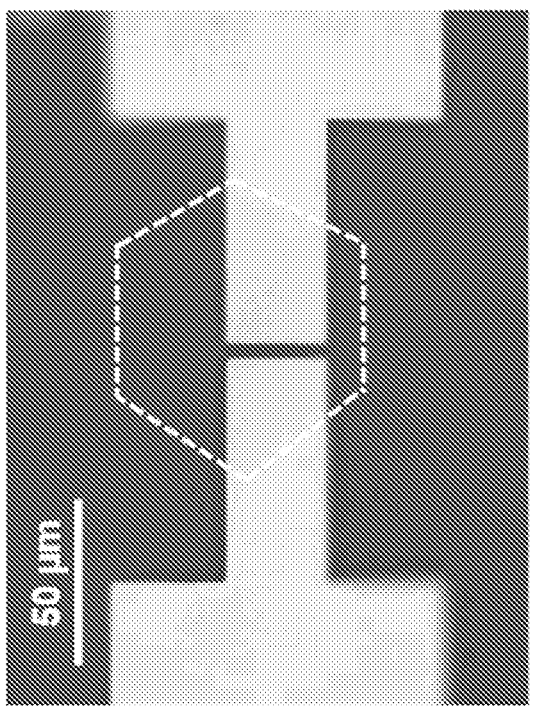
FIG. 4B is a microscope image of a polyimide flexible substrate with source/drain electrodes after being transferred, according to certain exemplary aspects of the present disclosure.
Figure 4C:
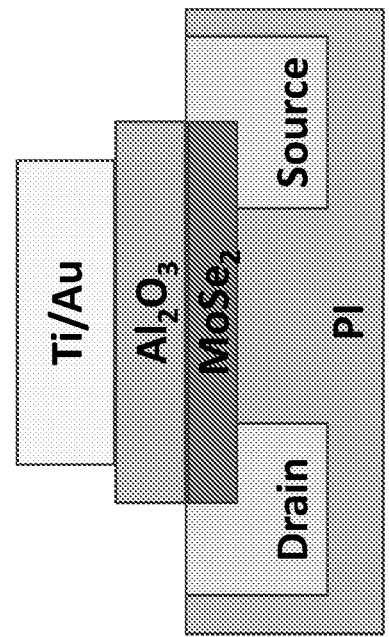
FIG. 4C is a diagram illustrating the device architecture, involving $MoSe_2$ as an exemplary TMD in a TMD-based material, of FET manufactured according to certain exemplary aspects of the present disclosure.

In FIG. 4A, a microscopic image of such an above-noted FET structure shows the $MoSe_2$ polyimide and source/drain Au, patterned, electrodes on a substrate before being transferred. FIG. 4B is a microscopic image of $MoSe_2$ polyimide and source/drain Au, patterned, electrodes after being transferred. In certain examples, the growth need not be continuous and the transistor features/structures do not have to be aligned as seen as flakes in FIG. 4A. Such flakes may also be easily transferred together with the contacts on the polyimide-based substrate, as seen in FIG. 4B. The construction of a completed FET, as shown in the example of FIG. 4C, illustrates the released polyimide layer and electrodes after being flipped and then followed by the deposition $MoSe_2$, $Al_2O_3$, and Ti/Au. As with FIGS. 2A and 2B, in certain experimental embodiments, to confirm that the TMD-based material remain structurally intact throughout the transfer process, Raman spectroscopy and photoluminescence (PL) measurements were performed before and after transferring. The Raman spectroscopy reveals minimal peak shifts which verifies uniformity of the transfer.

Figure 5B:
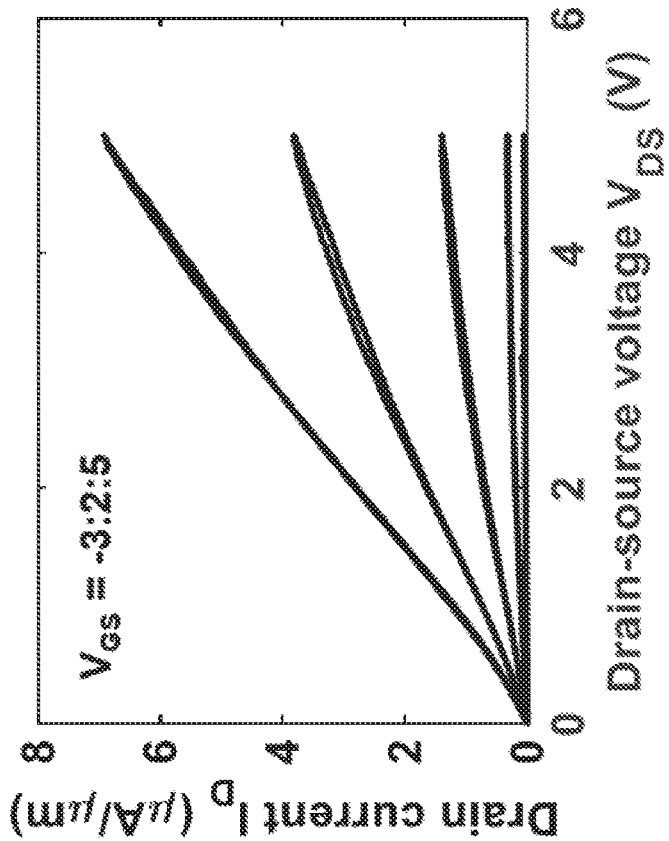
FIG. 5B is a graph of drain current versus drain-source voltage of transistors on polyimide, similar to FIG. 5A, according to certain exemplary aspects of the present disclosure.
Figure 5A:
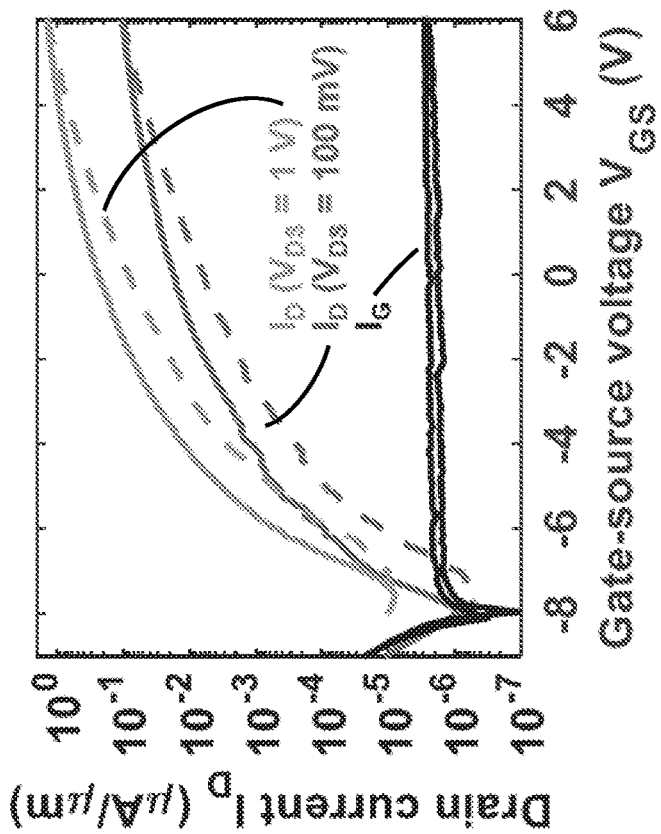
FIG. 5A is a graph of drain current versus gate-source voltage involving $MoSe_2$ as an exemplary TMD in a TMD-based material so as to use $MoSe_2$-based transistors on a layer including polyimide, according to certain exemplary aspects of the present disclosure.

FIGS. 5A and 5B illustrate performance for example FETs manufactured using some of the above-described methodology. FIG. 5A is an example graph of drain current versus gate-source voltage of a $MoSe_2$ transistors on polyimide. This illustrates the transfer characteristics of a FET constructed using techniques describe in examples herein, and constructed including $MoSe_2$. FIG. 5B is a graph of drain current versus drain-source voltage of a $MoSe_2$ transistors on polyimide. This illustrates the output characteristics of a FET constructed using techniques describe in examples herein, and constructed including $MoSe_2$.

Figure 6B:
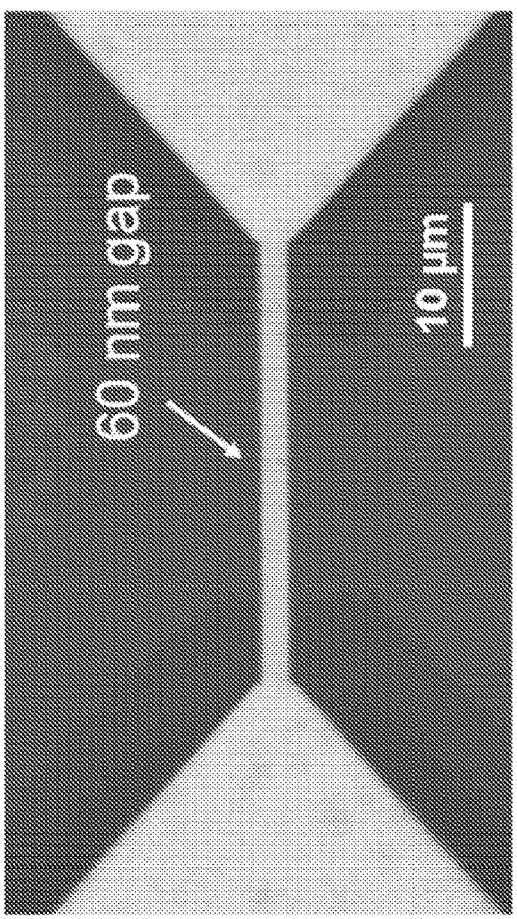
FIG. 6B is a microscopic image of a nanogap channel, involving $MoS_2$ as an exemplary TMD, after transfer, according to certain exemplary aspects of the present disclosure.
Figure 6A:
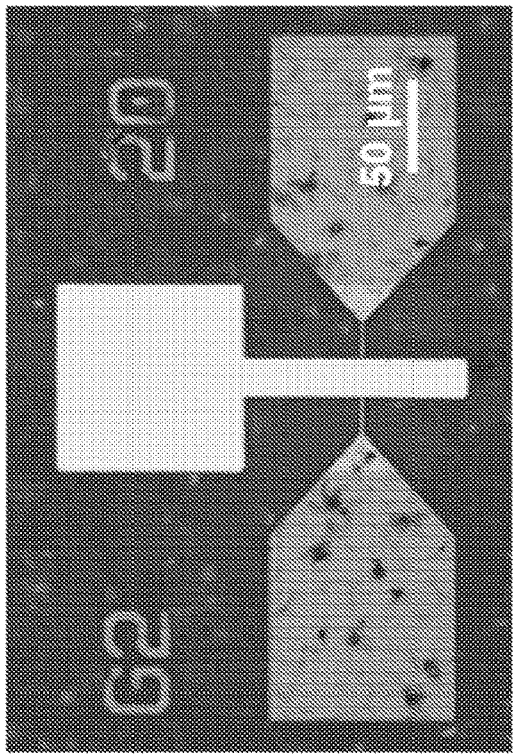
FIG. 6A is a microscopic image of a transistor with short channel contacts, involving $MoS_2$ as an exemplary TMD, after fabrication and according to certain exemplary aspects of the present disclosure.

FIGS. 6A and 6B illustrate yet other examples with impressive dimensional details useful in connection with FETs. FIG. 6A shows an optical microscopic image of a fabricated $MoS_2$ transistor with nanoscale channel. FIG. 6B displays an optical microscope image of a fabricated $MoS_2$ transistor with 60 nm gap between Au metal electrodes after transfer.

FIG. 7A is a diagram illustrating a side profile of vertical 2D stack structure as might be used, for example, as an active device for a memory cell and/or another (e.g., FET-based) device, also according to the present disclosure. This diagram exemplifies the many above-discussed FET-based examples in which a multilayered structure includes TMD material and a polyimide-based layer (as a representative polymer-based material) with the structure exhibiting flexibility independent of another structure (e.g., growth substrate). A first layer, under a dielectric and gate, is shown to include TMD-based material. This layer may have been provided or grown on a surface of a growth substrate which in certain instances may have been a rigid platform or substrate and is no longer part of the FET-based structure. A plurality of electrodes are shown as being as part of the first layer, and thereunder another layer or film including a polymer-based material (e.g., polyimide or (PI) is applied to cover the first layer and including the electrodes and the TMD-based material. These layers are integrated with the TMD material and the first layer, and the other polymer-based layer provides a flexible substrate. In another more-specific example, another dielectric layer (not shown in FIG. 7A) may be included between the first layer and the other PI-based layer.

FIG. 7B is a diagram resembling FIG. 7A but also showing an outline of a portion of the device, including the integrated layers (with the TMD material and the first layer), that may have been transferred together once released or separated from a surface of a growth substrate as manufactured according to various examples disclosed herein.

FIG. 7C is another diagram illustrating a side profile of another device according to the present disclosure. For example, the device may be part of a FET or another non-FET device such as a diode-based structure not necessarily including a gate) and such device is shown to have a vertical 2D (2-layer) stack structure and may also be part of a 3D stack structure.

FIG. 7D is another diagram illustrating a side profile of a specific example consistent with each of the examples corresponding to FIGS. 7A, 7B and 7D, also according to the present disclosure.

In connection with such examples as in FIGS. 7A-7D, a constructed FET device may be formed channel with various customized dimensions such as the above gaps as shown in FIG. 6B. In other specific examples, the FET channel may have a length set anywhere in the range of 10 micrometers to 1 nanometer. In yet other specific examples, the FET channel may have a length in the range of 20 micrometers to 1 nanometer.

In the above and yet further examples consistent with the present disclosure, the first layer and/or the TMD-based material (or "TMD material") includes one, or a combination of, the following: $WSe_2$, $MoSe_2$, $MoS_2$, $WS_2$, InSe and MoTe, silicon, carbon nanotubes, and graphene. In this regard and such examples, it is appreciated that the TMD material may be a material that is entirely composed of at least one TMD, or a material which is predominantly one or more TMDs and also including such other materials as listed above alone or in combination.

Another example embodiment of the present disclosure involves an apparatus including a semiconductor device. The semiconductor device may include a first layer including TMD material. It may also include electrodes formed on, or as part of, the first layer. The semiconductor device may also include another layer, including polyimide, over the first layer and the plurality of electrodes. This layer may be integrated with the TMD layer and the first layer. The first with the other layer, may be released from the surface for providing a structure with flexibility that is independent of the above-noted exemplary surface. As in a more specific example, the other layer may be a flexible substrate (as useful for further processing of the semiconductor device).

Another example of the present disclosure involves an apparatus including a semiconductor device where it includes or is part of a device including the flexible substrate. Also, the semiconductor device may include at least one of a combination of the following: an opto-electronic device (e.g., solar cell, laser diode or light emitting diode); a memory device; a photo detector; a temperature sensor; a strain sensor, and a bio sensor configured to sense changes (e.g., in vivo or bio-sensing in a liquid).

MORE SPECIFIC/EXPERIMENTAL EXAMPLES AND ASPECTS

In specific/experimental examples, process versatility has been shown by applying it to several exemplary TMDs (such as $MoS_2$, $WSe_2$ and $MoSe_2$), which preserved their material quality as confirmed by Raman spectroscopy and PL measurements. This has been shown in connection with one example being a flexible $MoSe_2$ FET, and works well with $WSe_2$ on flexible substrates where it has been shown via high parameters such as $I_{D,on}$ of ~3.5 $\mu A \cdot \mu m^{-1}$ at $V_{DS}=1$ V. For $MoS_2$ FETs, $I_{D,on}$ of ~470 $\mu A \cdot \mu m$ and certain examples herein, the present disclosure shows that channel lengths down to 50 nm can be realized with this technique, which are impressively short for a flexible $MoS_2$ FET. Further, optimization has been made up to $I_{D,on}$ in $MoS_2$ FETs as being comparable to graphene FETs and c-Si FETs. These results together with further optimizations of electrostatic control (e.g., thinner gate dielectrics or double-gates) and parasitics serve to advantage approaches involving utilizations of flexible TMD FETs for low-power high-performance IoT applications.

As noted above, other aspects of the present disclosure are directed to two-dimensional (2D) semiconducting transition metal dichalcogenides (TMDs) as good candidates for high-performance flexible electronics. However, some previous demonstrations of such flexible field-effect transistors (FETs) to date have had dimensions in the micron scale, not fully benefitting from the short-channel advantages of 2D-TMDs. In connection with experimentation of such aspects, the present disclosure remarkably demonstrate: flexible monolayer $MoS_2$ FETs with the short channel lengths (e.g., down to 50 nm), high field-effect mobility (e.g., up to ~30 $cm^2V^{-1}s^{-1}$) and high on-current (e.g., up to ~470 $\mu A \cdot \mu m^{-1}$ (which is comparable to flexible graphene or crystalline silicon FETs). This may be achieved using an example transfer method, according to the present disclosure, wherein FET contacts are initially patterned on the rigid TMD growth substrate (taking advantage of nanoscale lithography), then coated with a polyimide (PI) film which becomes the flexible substrate after being released, with the contacts and TMD. Also, a transfer process has been implemented for other TMDs, like $WSe_2$ and $MoSe_2$, introducing minimal damage or contamination to these materials. Constructed $WSe_2$ FETs also exhibit record-high on-currents on flexible substrates, and at the same time, this is the first report on flexible $MoSe_2$ FETs. Combined, these achievements push 2D semiconductors closer to a technology for low-power and high-performance flexible electronics.

In other examples, aspects are directed to a transfer process for TMDs with lithographically predefined metal contacts. Therein, the flexible polyimide (PI) substrate is spin-coated on top of the pre-patterned structures and all are released together in a substance that does not abrade or destroy a portion or the contacting surface of the first layer when applied. One exemplary substance is deionized (DI) water. Other examples of exemplary substances are light acids and bases such as NaOH, HF, KOH, TMAH, $FeCl_3$. This approach enables a flat TMD surface because the metal contacts can be conformally embedded into the PI substrate, and the definition of the contacts on the rigid growth substrate prior to the transfer facilitates the use of lithography techniques for small transistor dimensions such as electron-beam lithography (EBL). With this technique, FETs in the staggered configuration (the semiconductor is sandwiched between source/drain and gate) with $MoS_2$, $WSe_2$ and $MoSe_2$, have been demonstrated. Furthermore, due to the large carrier mobility of ~30 cm2/Vs in $MoS_2$ and the possibility of continuous monolayer growth, various flexible $MoS_2$ FETs were fabricated with channel lengths down to 50 nm reaching high on-currents up to ~470 $\mu A \cdot \mu m-1$ at a drain-source voltage $V_{DS}$ of 1 V. This on-current is more than three times higher than conventional levels for flexible $MoS_2$ FETs, very high for TMD FETs including rigid substrates (at $V_{DS}=1V$), and comparable to on-currents for flexible transistors with high-mobility channels such as graphene or single-crystal silicon (c-Si).

In yet further specific/experimental examples, TMDs were grown on $Si/SiO_2$ substrates using solid-source chemical vapor deposition (CVD) as may be conventional. Subsequently, Au metal contacts were lithographically patterned on top so as to provide embedded contacts to be part of the integrated layers to be transferred. Au is advantageous as a contact material because of its low $R_c$ to $MoS_2$ and its low adhesion to $SiO_2$. Hence, both Au and the TMD (lacking out-of-plane dangling bonds) can be released from $SiO_2$ surfaces without damage as shown below. After the definition of the metal contacts, a ~5 $\mu m$ thick PI was spin coated on top which conformably covers the $Si/SiO_2$ substrate including the TMD and metal contacts. After the PI is cured at 250° C. in nitrogen ambient, the TMD together with the metal contacts can be released from the $Si/SiO_2$ growth substrate by immersion and agitation in DI water. Noteworthy, a similar damage-free transfer of $MoS_2$ (without contacts) for wafer-scale coplanar (both source/drain and gate on top of $MoS_2$) micron-sized FETs has recently been demonstrated, showing the possibility to scale up this approach. Certain microscopic images (e.g., as in FIG. 4B) show that the TMD (e.g., $MoS_2$) is completely delaminated from the area that had been covered by PI on the $Si/SiO_2$ substrate. Continuous, as well as pre-patterned, $MoS_2$ with embedded contacts can be transferred enabling the realization of devices based on several fabrication approaches: FETs with $MoS_2$, $MoSe_2$ and $WSe_2$, were also fabricated where only contacts were patterned before transfer minimizing process steps on unprotected TMD-based material, leading to semiconductor widths greater than the electrode widths (referred to as Type A). In addition, FETs were realized where the $MoS_2$ was predefined by reactive ion etching (RIE) before transfer, which enables accurate channel definition by reducing the semiconductor width to a smaller value than the electrode width (referred to as Type B).

As discussed above, the TMD-based materials remain structurally intact throughout the transfer process, as confirmed by Raman spectroscopy and photoluminescence (PL) measurements before and after transferring. While the Raman and PL peaks of $WSe_2$ and $MoSe_2$ on the PI surface can be resolved, the $MoS_2$ Raman peaks are buried below a large background signal. However, on the Au/PI surface the Raman signature of all three TMDs is visible. It has been found that the PL peaks for $WSe_2$ and $MoSe_2$ can be detected on PI and Au/PI despite the strong PL quenching that is known to appear on Au surfaces. However, the PL signal for MoS$_2$ after transfer were not detected, which is due to the higher PL peak energy, which coincides with a larger background signal on the PI and Au/PI surfaces. The PL peak energies of MoS$_2$, WSe$_2$ and MoSe$_2$ of ≈1.86 eV, ≈1.59 eV and ≈1.54 eV indicate monolayer thicknesses. While these results were consistent for MoS$_2$ and WSe$_2$ across the substrate, it has been found that MoSe$_2$ had areas with monolayers and bilayers, where the PL peak is shifted towards ≈1.50 eV and its intensity is significantly reduced. Generally, the absence of major changes in Raman and PL before/after the transfer indicates that the TMDs remain unharmed, and that mono—as well as multilayer TMDs can be readily transferred with this technique. In the supporting information, a detailed analysis of Raman and PL peak positions can be found.

Flexible Staggered Top-Gated Field-Effect Transistors. After the transfer process, the source/drain contacts are embedded within the PI substrate and the TMD semiconductor is on top. To prevent any contaminants at the semiconductor/dielectric interface, an Al$_2$O$_3$ gate dielectric was deposited immediately after the transfer process and prior to any other patterning steps. The fabrication process is finalized with the gate metal definition. Only for MoS$_2$ FETs of Type A, RIE was deployed to pattern the semiconductor and gate dielectric together after the gate metal deposition. For fabrication details, see the supporting information. The transfer and output characteristics of micron-scale FETs with WSe$_2$, MoSe$_2$ (both Type A) and MoS$_2$ (Type B) all displaying n-type behavior. $V_T$ and $\mu_{FE,ext}$, were extracted at the transconductance (gm) maximum employing the measured capacitance from the TMD FETs obtained in accumulation, which corresponds to the Al$_2$O$_3$ dielectric capacitance. The monolayer WSe$_2$ FET exhibits a maximum on-current $I_{D,on}$ of ~3.5 µA·µm$^1$ at a drain-source voltage $V_{DS}$=1 V, which is a >2-fold increase in $I_{D,on}$ compared to the highest reported for flexible WSe$_2$ (using two layer thick exfoliated material) to date. The MoSe$_2$ FET exhibits an extrinsic field-effect mobility $\mu_{FE,ext}$ of 1.4 cm$^2$V$^{-1}$s$^{-1}$ and $I_{D,on}$~4.2 µA·µm$^1$ (at $V_{DS}$=4 V), which is believed to be the first demonstration on flexible MoSe$_2$ FETs. Note, that the hexagon-shaped crystal grains for the selenide-based FETs were not patterned and are subject to current spreading effects, which has been corrected for in abovementioned values for $\mu_{FE,ext}$, and $I_{D,on}$. The numerical simulation for this current spreading correction is described in the supporting information. All values for $\mu_{FE,ext}$ and $I_{D,on}$ for Type A devices reported in this manuscript are corrected for current spreading, which is not necessary for Type B devices because of the optimized geometry and modified fabrication process flow. Hence, the $I_{D,on}$ for MoS$_2$ FETs of Type B is width-normalized and a $\mu_{FE,ext}$ of 25.7 cm$^2$V$^{-1}$s$^{-1}$ and $I_{D,on}$ of 67.3 µA·µm$^{-1}$ (at $V_{DS}$=5 V) was obtained. In comparison, MoS$_2$ FETs of Type A have higher subthreshold swing SS and off-current reducing the ON/OFF ratio to ≈3.6·10$^3$, which can be attributed to a significantly larger MoS$_2$ area. Note, that the hexagon-shaped crystal grains for the selenide-based FETs were not patterned and are subject to current spreading effects, which has been corrected for in abovementioned values for $\mu_{FE,ext}$, and $I_{D,on}$. The numerical simulation for this current spreading correction is described in the supporting information. All values for $\mu_{FE,ext}$ and $I_{D,on}$ for Type A devices reported in this manuscript are corrected for current spreading, which is not necessary for Type B devices because of the optimized geometry and modified fabrication process flow. Hence, the $I_{D,on}$ for MoS$_2$ FETs of Type B (FIG. 2g,j) is width-normalized and a $\mu_{FE,ext}$ of 25.7 cm$^2$V$^{-1}$s$^{-1}$ and $I_{D,on}$ of 67.3 µA·µm$^{-1}$ (at $V_{DS}$=5 V) was obtained. In comparison, MoS$_2$ FETs of Type A have higher subthreshold swing (SS) and off-current reducing the ON/OFF ratio to ≈3.6·10$^3$, which can be attributed to a significantly larger MoS$_2$ area. Comparing device hysteresis, it has been found that maximum values remain below 1.4 V for all device types and TMDs, which indicates that the additional etch step does not deteriorate the TMD interfaces. Additionally, for certain experimental examples it has been verified that the stability of the flexible TMD FETs under tensile bending and found negligible changes for a static bending radius of 4 mm.

As the CVD growth of MoS$_2$ is the most mature growth process, leading to the highest $\mu_{FE,ext}$, $I_{D,on}$ and best surface coverage among the TMDs that were synthesized, investigations went further to study channel length scaling down to 50 nm employing EBL for source/drain contact patterning. First, it was verified that the EBL process does not induce damage to MoS$_2$, since there have been reports that highly energetic electron beams can cause the formation of strain and defects in MoS$_2$. Raman and PL measurements on MoS$_2$ before and after EBL were performed, finding no evidence of any damage to MoS$_2$. The following device fabrication and transfer was performed in the same way as described above. The cross-section reveals that the Al$_2$O$_3$ gate dielectric covers the planar source/drain electrodes including a 100 nm nano gap and illustrates the absence of "steps" in surface topography enabled by this fabrication technique where contacts are embedded within the flexible substrate. Electrical characteristics of a Type B device with a 100 nm long channel show excellent switching characteristics with a high $I_{D,on}$ of 303 µA·µm–1 (at $V_{DS}$=1.4 V) and a of 7.2 cm$^2$V$^-$1s$^{-1}$, which is smaller compared to micron-scale devices due to increased contributions from contact resistance as discussed later. The output characteristic shows signs of self-heating and velocity saturation due to the onset of saturation at lower $V_{DS}$ with higher gate-source voltages $V_{GS}$, which is similar to MoS$_2$ FETs with small channel lengths on silicon.

For better insight into intrinsic device parameters, $I_{D,on}$ at the same overdrive voltage $V_{ov}$=$V_{GS}$–$V_T$ and $\mu_{FE,ext}$ for channel lengths ranging from 50 nm to 10 µm were extracted. A model was utilized which can predict $I_{D,on}$ and $\mu_{FE,ext}$ as a function of channel length based on input parameters such as R$_c$ and the intrinsic field-effect mobility $\mu_{FE}$ to estimate these in the data set. Both the $V_T$ and $\mu_{FE,ext}$ extractions and the employed model are described in the supporting information. The drop in $\mu_{FE,ext}$ and saturating shape of $I_{D,on}$ for decreasing channel lengths (<1 µm) indicate that the devices enter a significantly contact limited regime. It has been found that the best estimated $\mu_{FE}$ and R$_c$ are 29 cm$^2$V$^{-1}$s$^{-1}$ and 310 Ω·µm, respectively. These $\mu_{FE,ext}$ and R$_c$ are comparable to best reported values for monolayer MoS$_2$ on flexible substrates and on silicon, respectively. Furthermore, a remarkably high $I_{D,on}$ of ~470 µA·µm$^{-1}$ for a 70 nm long channel device was obtained. This is >3 times greater than the highest values for flexible MoS$_2$ FETs, similar to highest $I_{D,on}$ for TMD FETs on rigid substrates, and even comparable to flexible FETs based on graphene and c-Si.

It is recognized and appreciated that as specific examples, the above-characterized figures and discussion are provided to help illustrate certain aspects (and advantages in some instances) which may be used in the manufacture of such structures and devices. These structures and devices include the exemplary structures and devices described in connection with each of the figures as well as other devices, as each such described embodiment has one or more related aspects which may be modified and/or combined with the other such devices and examples as described hereinabove may also be found in the Appendices of the above-referenced Provisionals.

The skilled artisan would also recognize various terminology as used in the present disclosure by way of their plain meaning. As examples, the Specification may describe and/or illustrates aspects useful for implementing the examples by way of various semiconductor materials/circuits which may be illustrated as or using terms such as layers, blocks, modules, device, system, unit, controller, and/or other circuit-type depictions. Also, in connection with such descriptions, the term "source" may refer to source and/or drain interchangeably in the case of a transistor structure. Such semiconductor and/or semiconductive materials (including portions of semiconductor structure) and circuit elements and/or related circuitry may be used together with other elements to exemplify how certain examples may be carried out in the form or structures, steps, functions, operations, activities, etc. It would also be appreciated that terms to exemplify orientation, such as upper/lower, left/right, top/bottom and above/below, may be used herein to refer to relative positions of elements as shown in the figures. It should be understood that the terminology is used for notational convenience only and that in actual use the disclosed structures may be oriented different from the orientation shown in the figures. Thus, the terms should not be construed in a limiting manner.

Based upon the above discussion and illustrations, it is appreciated that various modifications may be made to the various examples without strictly following the representative discussions and applications illustrated and described herein. For example, methods as exemplified herein may involve steps carried out in various orders, with one or more aspects retained, expanded and/or combined to involve more or fewer steps.

What is claimed:

1. A method for manufacturing a semiconductor device, the method comprising:
   on a surface, forming a first layer having TMD (transition metal dichalcogenide) material and being characterized at least in part by a transparency metric that is limited by a transparency characteristic that is associated with at least one of the TMD material and a second layer that is integrated with the TMD material and the first layer;
   forming a plurality of electrodes on or as part of the first layer; and
   applying the second layer, including a polymer, to cover the first layer and the plurality of electrodes, and wherein the second layer provides a flexible substrate.

2. The method of claim 1, wherein the semiconductor device includes a field effect transistor (FET) and the electrodes are source/drain electrodes of the FET, the method further including forming a channel associated with the FET.

3. The method of claim 2, wherein forming the channel includes patterning the channel using reactive ion etching.

4. The method of claim 1, wherein forming the electrodes includes patterning using lithography.

5. The method of claim 1, wherein forming the electrodes includes deposition by e-beam evaporation and/or sputtering.

6. The method of claim 1, wherein forming the electrodes includes atomic-layer deposition.

7. The method of claim 1, wherein the TMD material of the first layer is at least predominantly composed of at least one type of TMD.

8. The method of claim 1, wherein the surface is part of a rigid substrate from which the second layer is released.

9. The method of claim 1, wherein the TMD material of the first layer is characterized by having or exhibiting a high carrier mobility within a range from 10 $cm^2V^{-1}s^{-1}$ to 200 $cm^2 V^{-1}s^{-1}$.

10. The method of claim 1, wherein a structure, representing the second layer integrated with the first layer, the polymer, the TMD material and the electrodes, is characterized by a flexibility bending radius metric in a range from 10 mm to 100 micrometers.

11. The method of claim 1, wherein the semiconductor device includes a field effect transistor (FET), the method further including forming a channel being associated with the FET and having a channel length dimension within a range of 10 micrometer to 1 nanometer.

12. The method of claim 1, wherein the semiconductor device includes a field effect transistor (FET), the method further including forming a channel being associated with the FET and having a channel length dimension within a 20 micrometer to 1 nanometer.

13. The method of claim 1, wherein the TMD material includes one of among, or a combination from among, the following: $WSe_2$, $MoSe_2$, $MoS_2$, $WS_2$, InSe and MoTe, silicon, black phosphorus, carbon nanotubes, and graphene, wherein each of $WSe_2$, $MoSe_2$, $MoS_2$, $WS_2$, InSe and MoTe is a TMD.

14. The method of claim 1, further including releasing or separating the second layer integrated with the TMD material and the first layer, from the surface, through application of one of, or a combination from among the following: deionized water, an acid that does not abrade or destroy a portion of the first layer when applied, and a base that does not abrade or destroy a portion of the first layer when applied.

15. The method of claim 1, further including providing a dielectric layer between the first layer and the second layer.

16. The method of claim 1, wherein the first and second layers provide a degree of transparency which is set relative to a conductivity attribute of the semiconductor device.

17. A method for manufacturing a semiconductor device, the method comprising:
   forming a first layer having TMD (transition metal dichalcogenide) material and being characterized at least in part by a transparency metric;
   integrating a plurality of electrodes with the first layer; and
   applying a second layer to cover the first layer and the plurality of electrodes, wherein the second layer includes a polymer, is integrated with the TMD material and the first layer and provides a flexible substrate, and the semiconductor device is an optical electronic device adapted to pass or manipulate light, and the transparency metric is limited by a transparency characteristic that is associated with at least one of the TMD material and the second layer.

18. An apparatus including a semiconductor device, the apparatus comprising:
   a surface having thereon a first layer including TMD (transition metal dichalcogenide) material and being characterized at least in part by a transparency metric that is limited by a transparency characteristic associated with at least one of the TMD material and a second layer which includes polymer;
   a plurality of electrodes formed on or as part of the first layer; and the second layer being over the first layer and the plurality of electrodes, and being integrated with the TMD material and the first layer and providing a flexible substrate.

19. The apparatus of claim 18, wherein the surface is part of a rigid foundation and any bonds between the surface and the flexible substrate are releasable or separable from the flexible substrate by application of a substance that does not abrade or destroy a portion of the first layer when applied, and wherein the apparatus characterizes formation of the semiconductor device before being completely manufactured.

20. The apparatus of claim 18, wherein the surface is part of a rigid foundation and any bonds between the surface and the flexible substrate are releasable or separable from the flexible substrate by application of a substance that does not abrade or destroy a portion of the first layer when applied.

21. The apparatus of claim 18, wherein the semiconductor device includes or is part of a device including the flexible substrate, and wherein the device includes at least one of a combination of: a solar cell; an opto-electronic device other than a solar cell; a memory device; a photo detector; a temperature sensor; and a bio sensor configured to sense changes in a biological substance.

22. The apparatus of claim 18, wherein the semiconductor device includes a field-effect transistor having the electrodes corresponding to source/drain contacts adjacent to the TMD material and having a transistor gate, and the TMD material includes a two-atom-thick or three-atom-thick layer of $MoS_2$.

23. The apparatus of claim 18, wherein the semiconductor device is adapted to pass light or manipulate light.

* * * * *